(12) United States Patent
Boczek et al.

(10) Patent No.: US 12,278,077 B2
(45) Date of Patent: Apr. 15, 2025

(54) ACTUATION DEVICE WITH MOVABLE SWITCHING ELEMENT, VEHICLE AND METHOD FOR ACTUATION

(71) Applicant: Huf Hülsbeck & Fürst GmbH & Co. KG, Velbert (DE)

(72) Inventors: Artur Boczek, Aalen (DE); Gerd Buschmann, Velbert (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 320 days.

(21) Appl. No.: 17/640,684

(22) PCT Filed: Aug. 27, 2020

(86) PCT No.: PCT/EP2020/073977
§ 371 (c)(1),
(2) Date: Mar. 4, 2022

(87) PCT Pub. No.: WO2021/043666
PCT Pub. Date: Mar. 11, 2021

(65) Prior Publication Data
US 2022/0336162 A1    Oct. 20, 2022

(30) Foreign Application Priority Data

Sep. 5, 2019 (DE) ..................... 10 2019 123 841.2
Dec. 27, 2019 (DE) ..................... 10 2019 135 829.9
Aug. 18, 2020 (DE) ..................... 10 2020 121 603.3

(51) Int. Cl.
*H01H 9/04* (2006.01)
*B60Q 1/00* (2006.01)
(Continued)

(52) U.S. Cl.
CPC ............. *H01H 9/04* (2013.01); *B60Q 1/0017* (2013.01); *B60Q 3/20* (2017.02); *E05B 81/77* (2013.01);
(Continued)

(58) Field of Classification Search
CPC ............ H01H 9/04; H01H 3/02; H01H 3/161; H01H 2003/007; B60Q 3/20;
(Continued)

(56) References Cited

U.S. PATENT DOCUMENTS 6,091,066 A * 7/2000 Sugihara .............. H03K 17/968
200/345
6,626,473 B1 9/2003 Klein et al.
(Continued)

FOREIGN PATENT DOCUMENTS

DE    102011008989 A1    7/2012
DE    102014107407 A1    11/2015
(Continued)

OTHER PUBLICATIONS

Office Action for European Application No. 20765231.4 mailed on Oct. 2, 2023, with its English translation, 8 pages.
(Continued)

*Primary Examiner* — Kristina R Fulton
*Assistant Examiner* — James Edward Ignaczewski
(74) *Attorney, Agent, or Firm* — Christian S. Hans; Bret E. Field; Bozicevic, Field & Francis LLP

(57) ABSTRACT

The invention relates to an actuation device (3) for installing on a vehicle part (2), in particular in the form of a door or a hatch, having an electric switch means (30) with at least one switch element (31) for initiating a vehicle function and having a housing unit (10) with at least one first and second housing section (11, 12), wherein the second housing section (12) can be moved from a rest position (I) into an actuation
(Continued)

Figure 1:
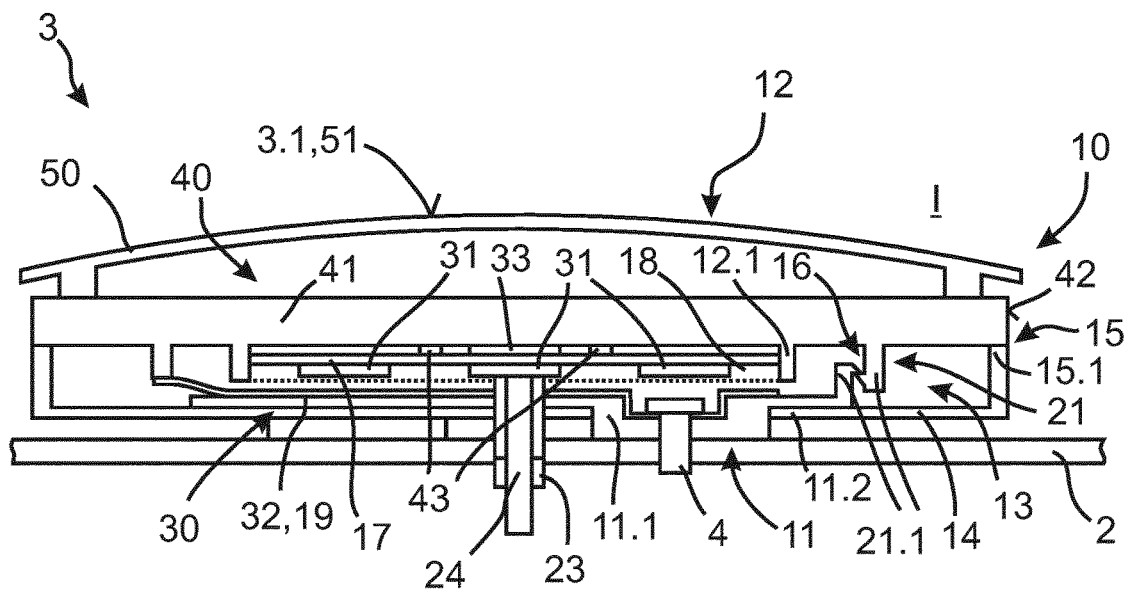

position (II) at least in some regions relative to the first housing section (11) in order to actuate the switch element (31). The invention additionally relates to a vehicle (1) and to an actuation method (100).

24 Claims, 4 Drawing Sheets

(51) Int. Cl.
*B60Q 3/20* (2017.01)
*E05B 81/76* (2014.01)
*G05G 1/02* (2006.01)
*G05G 5/05* (2006.01)
*G05G 25/00* (2006.01)
*H01H 3/02* (2006.01)
*H01H 3/16* (2006.01)
*E05B 81/54* (2014.01)
*H01H 3/00* (2006.01)

(52) U.S. Cl.
CPC .............. *G05G 1/02* (2013.01); *G05G 5/05* (2013.01); *G05G 25/00* (2013.01); *H01H 3/02* (2013.01); *H01H 3/161* (2013.01); *E05B 81/54* (2013.01); *G05G 2505/00* (2013.01); *H01H 2003/007* (2013.01)

(58) Field of Classification Search
CPC ....... B60Q 1/0017; E05B 81/77; E05B 81/54; G05G 1/02; G05G 5/05; G05G 25/00; G05G 2505/00
See application file for complete search history.

(56) References Cited

U.S. PATENT DOCUMENTS

| | | | |
|---|---|---|---|
| 7,777,141 | B2 | 8/2010 | Ishiguro |
| 9,487,974 | B2* | 11/2016 | Saitou .................... E05B 81/76 |
| 11,390,246 | B2* | 7/2022 | Spick ...................... B60R 25/20 |
| 12,142,449 | B2 | 11/2024 | Buschmann et al. |
| 2004/0256210 | A1* | 12/2004 | Morita .................... B66B 1/462 200/344 |
| 2008/0034821 | A1 | 2/2008 | Ishiguro |
| 2008/0034921 | A1* | 2/2008 | Vanheusden .......... B22F 1/0545 75/362 |
| 2010/0072050 | A1 | 3/2010 | Kubota |
| 2012/0039052 | A1* | 2/2012 | Valles Rangel .... G07C 9/00944 361/752 |
| 2015/0368935 | A1 | 12/2015 | Sugita et al. |
| 2016/0211094 | A1* | 7/2016 | Fuchs ..................... E05B 81/76 |
| 2016/0217953 | A1* | 7/2016 | Ely ...................... G06F 3/0202 |
| 2018/0209182 | A1 | 7/2018 | Beck et al. |
| 2022/0328263 | A1 | 10/2022 | Buschmann et al. |

FOREIGN PATENT DOCUMENTS

| | | |
|---|---|---|
| DE | 102015000465 A1 | 7/2016 |
| DE | 202016001147 U1 | 5/2017 |
| EP | 1108834 A2 | 6/2001 |
| WO | WO-0140607 A1 * | 6/2001 ............ E05B 85/10 |
| WO | WO2006106033 A1 | 10/2006 |
| WO | WO2018197771 A1 | 11/2018 |

OTHER PUBLICATIONS

Office Action for European Application No. 20767485.4 mailed on Oct. 4, 2023, with its English Translation, 8 pages.
Office Action for European Application No. 20765233.0 mailed on Oct. 4, 2023, with its English Translation, 8 pages.
Office Action for European Patent Application No. 20 765 231.4, mailed Mar. 11, 2024, and its English translation, 22 pages.

* cited by examiner

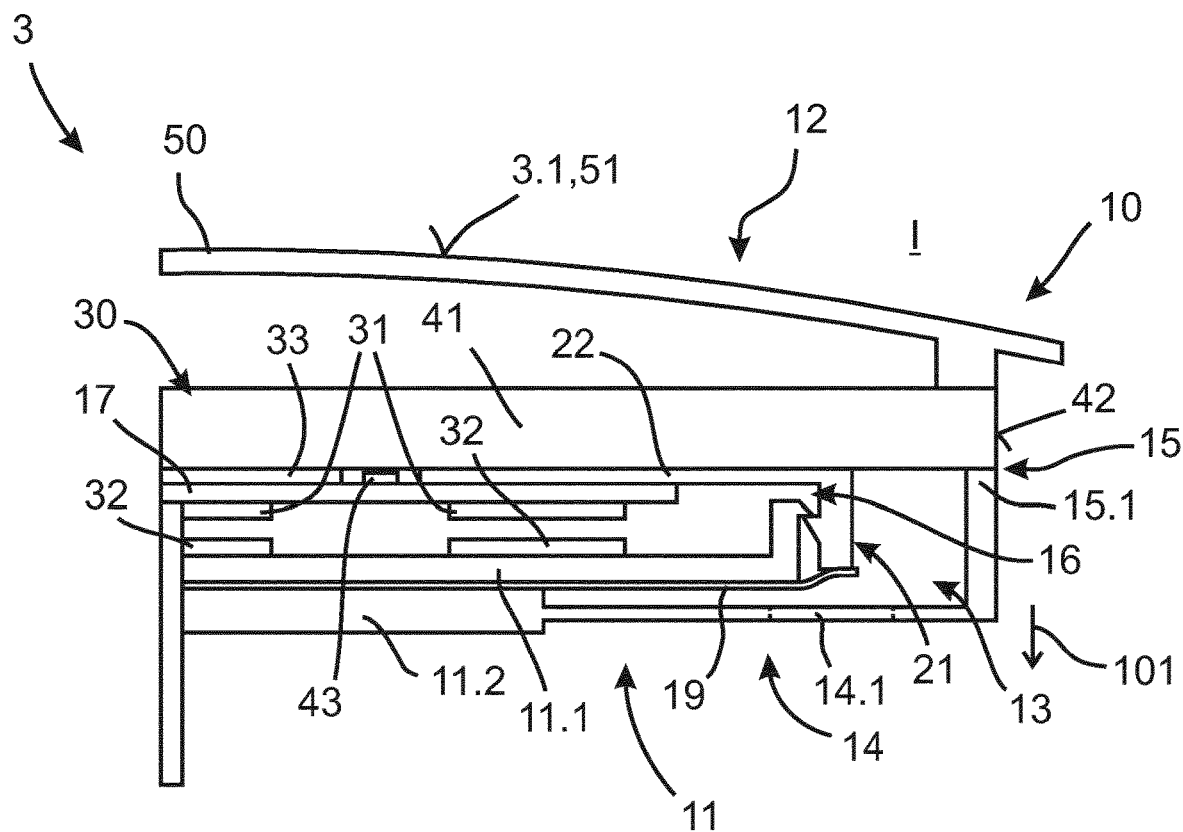
Fig. 9
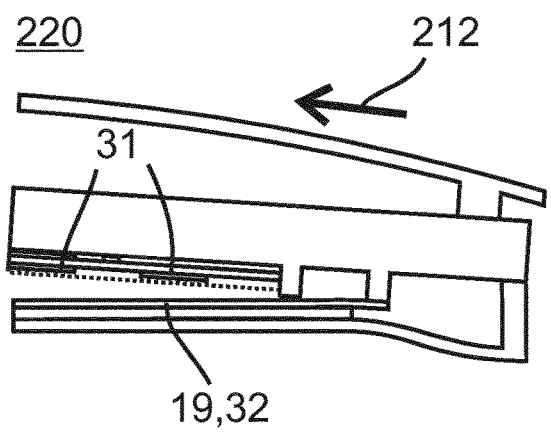 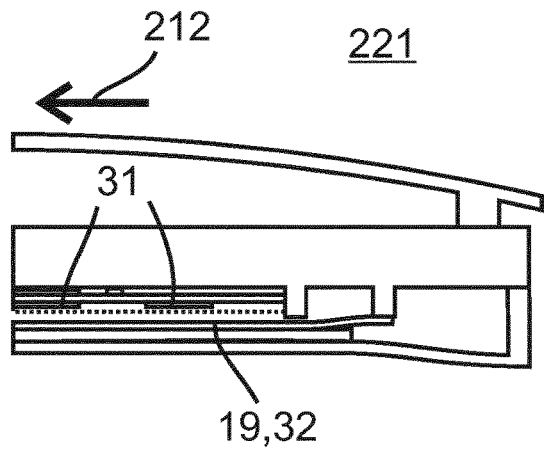
Fig. 10a   Fig. 10b

ACTUATION DEVICE WITH MOVABLE SWITCHING ELEMENT, VEHICLE AND METHOD FOR ACTUATION

The invention relates to an actuation device, a vehicle, and a method for actuation.

Prior art actuation devices for vehicles are known. These are usually mounted on a movable part, such as a tailgate, in order to enable a user to open the movable part. The opening is thereby triggered by an electrical switch, which outputs an electrical switching signal depending on the actuation by the user. However, sealing of such switches is often complex, particularly in the outer side of the vehicle. Further, the actuation devices are sometimes arranged in a recess of the vehicle panel. It is therefore desirable to design the actuation devices particularly compact and as flatly as possible.

Normally, an electric switch in such actuation devices is further arranged on the housing part fixed to the vehicle. However, since the housing part which is movable for actuating the respective actuation device usually has only a sealing function, an additional metal part is normally integrated there, in particular in the case of an electromagnetic switch, in order to trigger the switch.

It is an object of the present invention to at least partially eliminate the aforementioned disadvantages known from the prior art. In particular, it is an object of the present invention to enable a compact, preferably flat, actuation device in which a switching means/device is protected from the environment with improved actuating capability.

The foregoing object is solved by an actuation device having the features as described herein, a vehicle having the features as described herein, and a method for actuation having the features as described herein. Further features and details of the invention result from the respective dependent claims, the description and the drawings. In this context, features and details described in connection with the actuation device according to the invention also apply, of course, in connection with the vehicle according to the invention and/or the method for actuation according to the invention, and vice versa in each case, so that reference is or can always be made mutually with regard to the disclosure concerning the individual aspects of the invention.

In accordance with a first aspect of the invention, an actuation device is provided for mounting on a vehicle part, in particular in the form of a door or a flap. The actuation device comprises an electrical switching device having at least one switching element for triggering a vehicle function. Further, the actuation device comprises a housing unit with at least a first and a second housing section. The second housing section is at least partially or completely movable relative to the first housing section from a rest position to an actuation position for actuating the switching element. Thereby, it is further provided that the switching element is arranged at the second housing section, so that the switching element is moved along with the movement of the second housing section from the rest position into the actuation position.

In particular, the actuation device is configured to trigger a vehicle function as a result of an actuation by a user and/or as a result of an actuation of the switching device. Preferably, the actuation device is arrangeable on an outer side of the vehicle part. The vehicle part may, for example, be a vehicle panel. In particular, the vehicle part may be a movable vehicle part, such as a vehicle door, a hatch and/or a tailgate. However, it is also conceivable that the actuation device can be arranged on a rigid vehicle part, for example in order to actuate a movable vehicle part arranged next to it. In particular, the actuation device may form a push switch, in particular with a vehicle emblem, or a door handle. Furthermore, it is also conceivable that the actuation device can be arranged in an interior region of the vehicle.

The electrical switching device is preferably adapted to emit an electrical switching signal when the second housing section is moved from the rest position to the actuation position. The electrical switching device may, for example, be an electrical switch, in particular a microswitch. Furthermore, it is conceivable that the electrical switching element is an electronic component formed in cooperation with a further component for detecting the actuation. For example, the electrical switching element may comprise a semiconductor component which outputs the electrical switching signal when the actuation device is actuated. In particular, the switching device may comprise a plurality of switching elements in order to be able to control different vehicle functions and/or to increase an actuation range that can be detected by the switching device.

In order to ensure a power supply and/or signal routing of the electrical switching device, a cabling for the power supply and/or signal routing of the electrical switching element may be at least partially movable with the electrical switching element. Furthermore, it is conceivable that a cable guide is flexibly configured to enable the movement of the electrical switching element. In particular, if a distance covered during the movement from the rest position to the actuation position is short, it is also conceivable that only a flexible cabling section is provided in the immediate vicinity of the switching element in order to enable the power supply and/or signal routing of the switching element. In this regard, it is particularly conceivable that the housing unit comprises an opening for cable routing which can be arranged at an opening to a vehicle interior. A low level of moisture may be present in the vehicle interior, which is tolerable for the switching device to function properly.

The first and second housing sections may each have at least one housing element. In this regard, a first housing element of the first housing section may be attached to a second housing element of the second housing section in a connection area. Preferably, the first housing section and the second housing section may be attached to each other only in the connection area. When the second housing section is moved from the rest position to the actuation position, the second housing element may, for example, be moved completely or be warped in some areas.

For actuating the switching element in the actuation position, it may be provided that, in particular on the first housing section, a trigger element is provided which acts with the switching element to trigger an electrical switching signal of the switching element.

In that the switching element is arranged on the second housing section and moves at least partially with the movement of the second housing section from the rest position to the actuation position, wherein the movement can lead to a shortening of a distance between a trigger element for triggering the switching element. In particular, the movement of the second housing section from the rest position to the actuation position comprises a movement in the direction of the first housing section. When the distance between the trigger element and the switching element is shortened, a change in an electric and/or magnetic field between the trigger element and the switching element may advantageously be detectable or a mechanical actuation of the switching element may occur. As a result, the actuation device may be compactly configured and may advantageously allow actuation detection. Preferably, the trigger element may further be associated with a further function. For example, the trigger element may be formed by a part of a vehicle panel of the movable part or another metal part.

Furthermore, in an actuation device according to the invention, it may advantageously be provided that the first and second housing sections at least partially or completely form a housing interior in which the switching element is arranged. In this way, the switching element can be protected from external environmental influences, such as moisture. The housing interior may be divided into a plurality of subsections in which, for example, the trigger element and the switching element are arranged separately from one another. The housing interior may have a movement clearance between the first and second housing sections for moving the second housing section from the rest position to the actuation position. Preferably, the second housing section is at least partially movable into the movement free space when moving from the rest position to the actuation position. The movement free space may be limited by a stop. Preferably, the movement free space is configured in such a way that the second housing section, during the movement from the rest position into the actuation position, covers at least partially or completely a distance of less than or equal to 5 mm, preferably of less than or equal to 1 mm, particularly preferably of 0.1 mm to 0.3 mm. As a result, a tactile pulse or a swipe across the actuation device may be sufficient to actuate the switching element.

Preferably, within the scope of the invention, the housing interior extends at least regionally between the second housing section and a fluid-tight deformation area for elastically deforming the first housing section. The deformation area may be mechanically coupled to a circumferential connection area of the first and second housing sections, such that the connection area is movable with the second housing section as it moves from the rest position to the actuation position. In particular, the deformation area is configured for elastic deformation. As a result, a reformation can be automatically performed when the second housing section is moved from the actuation position to the rest position. In the actuation position, the second housing section may be elastically biased, for example by the deformation area, so that the second housing section automatically returns to the rest position. Due to the fact that the housing interior extends between the second housing section and the deformation area, the deformation area lies in particular below the second housing section as seen from outside of the actuation device. As a result, in particular lateral installation space can be saved.

In particular, the connection area is formed circumferentially around the housing interior and/or the first and/or second housing section. For example, the connection area may comprise connection sections distributed regularly or irregularly around the circumference of the housing interior and/or the first and/or second housing section. By means of the connection area, the first and second housing sections are in particular fixed to each other. Preferably, the first and/or second housing section and/or the housing interior has a circular circumference. Advantageously, the connection area may extend along the circular circumference. Preferably, the housing interior may comprise a closed, in particular fluid-tight, volume.

Due to the mechanical coupling of the deformation area and the circumferential connection area, the second housing section can be actuated directly or indirectly over its entire surface. Preferably, the actuation device can provide an actuation surface, in particular an external actuation surface, which can be used over its entire surface for actuating the switching device. At the same time, the actuation device can have a compact shape, i.e. in particular one that can be arranged flat on the vehicle part. Furthermore, an advantageous movability of the second housing element can be achieved via the deformation area. At the same time, the housing interior with the switching element can be protectable from environmental influences at least in certain areas by means of the deformation area.

Furthermore, in an actuation device according to the invention, it may advantageously be provided that the connection area is configured for fluid-tight connection of the first and second housing sections, in particular wherein the connection area comprises a continuously circulating connection of the first and second housing sections. In particular, the fluid-tight connection may be enabled by the continuous circumferential connection. Alternatively, a sealing means/element may be provided to seal unconnected portions. The fluid-tight connection may enable the connection section to provide a complete circumferential seal around the housing interior to protect the switching element from environmental influences. Further, the fluid-tight connection may allow the connection area region to be disposed, for example, on an outer periphery of the actuation device.

Furthermore, in an actuation device according to the invention, it is conceivable that the connection area comprises a material-locking connection of the first and second housing sections, in particular wherein the first housing section is bonded or welded to the second housing section. The material-locking connection may eliminate the need for a separate seal, for example in the form of an elastomer, for the housing interior. Advantageously, the connection area may comprise a circumferential weld seam. Thus, a fastening and a reliable sealing of the housing interior to the connection area can be achieved simultaneously. For example, the first and second housing sections may be bonded by a sealing paste or by a double-sided adhesive tape. Preferably, the first and second housing sections comprise a plastic material. This may allow for a simple welded connection. Furthermore, a material-locking connection has the advantage that the sealing achieved thereby provides a high degree of process reliability. For example, incorrect assembly of an additional component, such as a sealing ring or a double-sided adhesive tape, can be excluded.

Within the scope of the invention, it may be provided that the switching device comprises at least one trigger element for actuating the switching element, wherein the trigger element is arranged on the first housing section such that the switching element is moved towards the trigger element when the second housing section is moved from the rest position to the actuation position. The trigger element may be configured as an electrical counter element to the switching element, in order to trigger the switching element. Furthermore, it is conceivable that the trigger element comprises a mechanical stop by which the switching element is mechanically actuable to trigger an electrical switching signal. The release element may preferably comprise at least one further function, such as a sealing function, a resetting function for resetting the second housing section to the rest position and/or the like. The trigger element can thus enable the switching element to be actuated in a simple manner, in particular without increasing the number of components.

Furthermore, in an actuation device according to the invention, it can advantageously be provided that the switching device comprises an electromagnetic sensor unit with an electrically conductive conductor element which forms the trigger element, the switching element being designed for electromagnetic, in particular inductive or capacitive, detection of the conductor element. Preferably, the switching element thereby comprises a coil. For example, the sensor unit may comprise one or more LDC sensors. As a result, a required travel distance of the second housing section from the rest position to the actuation position may be shortened. Advantageously, the conductor element may comprise a metal, in particular a metal foil. Preferably, the conductor element is mechanically coupled to the first housing section or integrated into the first housing section. By means of the electromagnetic sensing means/element, a movement of the conductor element may advantageously be detectable via an electric field, i.e. for example by a change of the electric field. The sensing element may comprise a measuring device for directly or indirectly measuring an electromagnetic quantity. Thus, the switching device may be an inductive or capacitive sensor unit. In particular, in the case of an inductive sensor unit, the switching device may comprise a plurality of switching elements in order to allow a wide actuation range and/or detection range.

It is further conceivable that the switching device comprises a detection element for detecting an approach of a user, preferably by means of which the switching element, upon the approach of the user, can be brought from a deactivation state, in which the triggering of the vehicle function by the switching element is prevented, into an activation state, in which the triggering of the vehicle function by the switching element is enabled. In the deactivation state, actuation of the switching element may be prevented, and in the activation state, actuation of the switching element may be enabled. For this purpose, the switching element may, for example, be electrically separable from an electrical connection to the vehicle and/or to electronics of the actuation device. Furthermore, it is conceivable that the triggering of the vehicle function in the deactivation state is prevented by software. Preferably, the detection element may comprise a proximity sensor. The proximity sensor may, for example, be a capacitive sensor. However, it is also conceivable that the sensing element is configured to authenticate a user. For example, the proximity sensor may comprise a UWB and/or NFC interface, in particular in the form of an antenna. It is further conceivable that the sensing element comprises a Bluetooth interface, in particular in the form of a Bluetooth low energy (BLE) interface. By detecting the approach, a probability of a false triggering, for example during a journey of the vehicle, can be reduced. By the subsequently enabled, in particular manual, actuation of the switching device, a safety of the actuation device may further be increased.

Furthermore, in an actuation device according to the invention, it may advantageously be provided that the switching device comprises at least two or more electrical switching elements arranged in an actuation direction, so that by sweeping over the actuation device, in particular along the actuation direction, an actuating sequence can be effected in which the switching elements are actuated successively or differently. For example, a plurality of switching elements may be arranged in a row defining the actuation direction. The actuation sequence may comprise a plurality of actuation positions of the second housing section. In particular, the second housing section may have a different tilt angle in each of the actuation positions, resulting in different respective distances of the switching elements from the first housing section and/or from a trigger element associated with the respective switching element. In particular, a plurality of trigger elements may also be arranged on the first housing section. A complex actuation action may be detectable by the actuation sequence. Thus, a recognition of a request of the user may be improved. For example, false detections and/or accidental actuation actions may be reduced. Furthermore, different vehicle functions may be triggerable by different actuation actions, such as different actuation directions.

Preferably, in an actuation device according to the invention, it may be provided that the switching device is arranged on a printed circuit board which is fastened to the second housing section, in particular wherein the printed circuit board comprises electronics for evaluating sensor data of the switching device. The circuit board may be indirectly or indirectly or directly attached to the second housing section. Preferably, the second housing section has a retaining means/element to which the printed circuit board is attached in a form-fitting and/or material-locking manner. In particular, the retaining element can be formed circumferentially around the printed circuit board. For example, the printed circuit board can be clamped in the holding means/element. The printed circuit board may extend in the housing interior or form the housing interior with the first housing section and the deformation area at least partially. By evaluating the sensor data by the electronics in the housing interior, transmission losses can be kept low or avoided. During the evaluation, measured values of the switching device can, for example, be interpretable and/or digitizable by the electronics. Preferably, a false trigger can be detected by the evaluation on the basis of measured data of several switching elements of the switching device.

Furthermore, in an actuation device according to the invention, it may advantageously be provided that the printed circuit board is encapsulated with a potting compound or is covered with a protective lacquer. The printed circuit board, in particular with the electronics, may be completely embedded in the potting compound. For this purpose, a part of the interior of the housing may be filled with the potting compound. In particular, a safety region may be formed by the potting compound in the housing interior, which is preferably formed by the potting compound and the second housing section. The switching element is thereby arranged in particular in the safety region. This has the advantage of providing additional protection against environmental influences, in particular against moisture. The potting compound may comprise, for example, a resin, in particular a synthetic resin. A protective lacquer has the advantage that additional protection against moisture can also be provided. At the same time, the protective lacquer may take up only a small amount of space in the interior of the housing. The potting compound or the protective lacquer can increase the service life of the printed circuit board and/or the electronics. The potting compound or the protective lacquer may be arranged between the printed circuit board and the first and/or second housing section.

Further, in an actuation device according to the invention, it may be advantageously provided that the first housing section comprises a cover forming a connection section of the connection area. The connection section of the connection area may form, with a connection section of the second housing section, the connection area. Preferably, the cover member comprises the connection area. In particular, the cover member may form a vehicle side housing half of the housing unit. Preferably, the cover element comprises connection interfaces for connecting the actuation device to the vehicle part. In particular, the cover element can be screwed to the vehicle part. This may enable the actuation device to be securely fastened to the vehicle part. A fastener, such as a screw, may thereby be mounted to the cover element via the housing interior, such that the fastener is advantageously invisible from an outer side of the second housing section. The cover element may be formed as a unitary material or as a multi-component injection molded plastic part. For example, the cover element may comprise a soft component in the deformation area to allow or promote deformation.

Furthermore, in an actuation device according to the invention, it is conceivable that the cover element forms the deformation area, in particular whereby a restoring force can be exerted by the cover element against the movement of the second housing section from the rest position to the actuation position. For example, the cover element may comprise an elastically deformable plastic and/or a flexible shape to form the deformation area. Preferably, the cover element may have a thickness of less than 2 mm, more preferably less than 1 mm, in the deformation area. This may allow elastic deformation circumferentially around the housing section, i.e. in particular around the entire circumference of the deformation area. The restoring force may enable or support an automatic return of the second housing section to the rest position.

Furthermore, in an actuation device according to the invention it is conceivable that the housing unit comprises a spring element for exerting a restoring force against the movement of the second housing section from the rest position into the actuation position, in particular wherein the spring element is arranged in the housing interior. Advantageously, the spring element may comprise a spring steel or a resilient plastic. The spring element may, for example, be a leaf spring. The spring element may be formed separately from the deformation area. In particular, the restoring force may act in addition to a restoring force of the deformation area. However, it is also conceivable that the spring element forms the deformation area. In this case, the spring element may be integrated into the first or second housing section, i.e. in particular be part of the first or second housing section. Further, the spring element may extend circumferentially around the housing interior and/or the cover element. By means of the spring element, the second housing section may be automatically movable back into the rest position. If the spring element and the deformation area can each exert a separate restoring force, a resulting stiffness can have an advantageous effect on an actuation behavior of the second housing section.

It is further conceivable in an actuation device according to the invention that the spring element forms the conductor element of the switching device, in particular wherein a shortening of a distance of the spring element to the switching element can be detected by the switching element when the second housing section is moved from the rest position to the actuation position. Preferably, the spring element comprises or consists of an electrically conductive spring material. This allows the spring element to be part of the electromagnetic sensor unit. The change in the electric and/or magnetic field due to the shortening of the distance can be detected by the switching element. Thus, for example, an additional conductor element is not necessary. Thus, a small number of components can be achieved and thereby a complexity of the actuation device can be simplified.

Preferably, in an actuation device according to the invention, it may be provided that the connection area comprises the spring element, wherein the spring element extends circumferentially, in particular around a central region of the actuation device, in the connection area. In this respect, the spring element may advantageously be part of the first housing section. Preferably, the spring element may form a fluid-tight, elastically deformable housing surface. In particular, the housing surface formed by the spring element may be oriented towards the vehicle. In this regard, the spring element may in particular form the deformation area of the second housing section. In this way, the actuation device can be compactly designed and enable a reliable seal with few components.

Preferably, in an actuation device according to the invention, it can be provided that the spring element is connected to the second housing section in a form-fitting and/or material-locking manner, in particular wherein the spring element is embedded or clamped in a region-based manner in a housing material of the second housing section or wherein the spring element is bonded to the second housing section by a sealing element. As a result, the spring element may form a connection section of the connection area. For example, the spring element may be regionally overmolded and/or encapsulated with the housing material of the second housing section. Furthermore, it is conceivable that the spring element is clamped in a housing material of the second housing section. Additionally or alternatively, the spring element may be connected to the second housing section via a sealing paste, in particular in the form of a sealing bead. A form-fitting and/or material-locking connection of the spring element to the second housing section may enable a reliable connection of the spring element to the second housing section, and thus a reliable connection of the first and second housing sections. Furthermore, an advantageous sealing of the housing interior can thereby be created, in particular without requiring an additional seal.

Furthermore, it is conceivable in an actuation device according to the invention that the housing unit has a positioning means/device by which the rest position of the second housing section can be fixed, in particular in a form-fitting manner. From the rest position, it can thereby advantageously be possible to execute a renewed movement of the second housing section from the rest position into the actuation position in order to execute a further actuation. Advantageously, the positioning device may comprise a stop means/element of the second housing section and a counter stop means/element of the first housing section. Thereby, the stop element may abut against the counter stop element in the rest position to stop a restoring movement of the second housing section. In particular, the positioning device may be configured to allow movement of the second housing section only towards the actuation position when the second housing section is in the rest position. Advantageously, the positioning device may comprise a latching connection. In this way, an assembly of the actuation device may be simplified. For example, the first and second housing sections may be latched together by the positioning device. This may reduce a load on the connection area due to a restoring force.

Furthermore, in an actuation device according to the invention, it can advantageously be provided that an intermediate element is arranged between the first and second housing sections, by means of which the restoring force of the spring element can be transmitted to the second housing section and/or which has at least one positioning element of the positioning device. The positioning element may, for example, be a stop element of the second housing section. The intermediate element can serve as an adapter for establishing an operative connection between the first and second housing sections, in addition to the connection area. As a result, for example, moulded parts of the second housing section can be of simplified design in order to reduce their manufacturing costs. Furthermore, the intermediate element can be used to achieve a geometry which is advantageous for a force transmission and which is, in particular, independent of a manufacturing process of further components. Preferably, the intermediate element is fixed to the first and/or second housing section. In particular, the intermediate element may be arranged in the interior of the housing. As a result, it is not necessary, for example, for the intermediate element to contribute to sealing the housing interior.

Preferably, in an actuation device according to the invention, it may be provided that an illumination unit for illuminating the actuation device is arranged at least partially or completely in the housing interior. The illumination unit may improve a visibility of the actuation device, in particular in the dark. Furthermore, the illumination unit may serve as an indication to a user that the illuminated area on the vehicle is an actuation device. This may allow for intuitive operation of the actuation device. The illumination unit may comprise one or more illuminants, in particular in the form of one or more LEDs. By being arranged in the housing interior, the illumination unit may advantageously be protected from environmental influences. For example, the illumination unit may be arranged on the printed circuit board and/or on a support element of the first housing section.

It is further conceivable in an actuation device according to the invention that the second housing section comprises a light guide for guiding light of the illumination unit, in particular wherein the light guide comprises a light emitting surface formed circumferentially around the second housing section for circumferential illumination of the actuation device. In particular, the second housing section may be formed by the light guide. The light guide may be an at least partially transparent housing member of the second housing section. In this regard, the light guide may form a connection section of the connection area. In particular, the light emitting surface may be formed on the edge side of the connection area. This can enable advantageous utilization of the installation space, in which light can advantageously emerge to the outside. The circumferential light emitting surface can further enable advantageous illumination of the actuation device, in which the actuation surface is located in a central region of the illumination, which in particular is not itself illuminated. This may provide an intuitive indication of the actuation device on the vehicle. Furthermore, it may thereby be possible, for example, to arrange a logo, an instruction and/or a vehicle emblem in the central region without directly affecting the logo, the instruction and/or the vehicle emblem.

Furthermore, in an actuation device according to the invention, it may advantageously be provided that the second housing section comprises a vehicle emblem which forms an actuation surface for triggering the movement of the second housing section from the rest position into the actuation position, in particular wherein the vehicle emblem forms, in particular completely, an outer side of the actuation device. In particular, the vehicle emblem may be arranged on the light guide and/or a housing element of the second housing section. The vehicle emblem may thus form an intuitive indication for the user of the actuation surface. Furthermore, an area on the vehicle can thereby be used for the actuation which in any case comprises another component which is different from the vehicle part on which the actuation device is mountable. In particular, the light emitting surface may be arranged at the edge of the connection area. In particular, the light emitting surface may be oriented at least substantially or completely parallel to a surface of the vehicle part. In this regard, the vehicle emblem may completely cover the interior of the housing and/or the first housing section, so that only the vehicle emblem is visible when the actuation device is mounted on the vehicle part. The vehicle emblem can enable advantageous adaptation of the actuation device to a visual appearance of the vehicle and, in particular, at the same time provide additional protection against dirt.

It is further conceivable in an actuation device according to the invention that the housing interior comprises a compensating element for exchanging air with an environment, in particular wherein the compensating element is arranged on a cable guide for the switching device and/or the printed circuit board. This can, for example, enable a reduction of a volume of the housing interior, in particular which goes beyond a compressibility of air in the housing interior. The balancing element may be in the form of a valve. For example, the balancing element may comprise a sealing lip which allows air exchange in case of an overpressure and/or underpressure in the housing interior. The cable guide may connect the actuation device to a vehicle interior and/or to a functional element for the vehicle function actuatable by the actuation device, such as a lock for opening and/or closing the vehicle part. In particular, the switching device and/or the circuit board may be adapted to be supplied with electrical energy via cables of the cable guide. This may reduce the likelihood of dirt entering the housing interior at this point. Furthermore, the compensating element can compensate for a negative pressure and/or an excess pressure due to environmental conditions, such as a driving behavior of the vehicle or temperature fluctuations.

According to another aspect of the invention, a vehicle is provided. The vehicle comprises a vehicle part, in particular in the form of a door or a flap. It is further provided that an actuation device according to the invention is arranged on the vehicle part for triggering a vehicle function of the vehicle.

Thus, a vehicle according to the invention brings the same advantages as have already been described in detail with reference to an actuation device according to the invention. The vehicle is in particular a motor vehicle, preferably in the form of an electric vehicle or a hybrid vehicle. By advantageously sealing the actuation device, an electrification of vehicle functions may be simplified. By means of the actuation device according to the invention, in particular of compact design, an external appearance of the vehicle can furthermore be improved and/or installation space in the interior of the vehicle can be saved. Preferably, the vehicle part is an outer side vehicle part and/or a body part of the vehicle.

According to a further aspect of the invention, a method for actuation for triggering a vehicle function of a vehicle by an actuation device, in particular an actuation device according to the invention, having at least a first and a second housing section, comprising the following steps:

Actuating an electrical switching element of an electrical switching device for triggering the vehicle function by moving the second housing section with the switching element from a rest position to an actuation position, A return of the second housing section with the switching element to the rest position.

Thus, a method for actuation according to the invention brings the same advantages as have already been described in detail with reference to an actuation device according to the invention and/or a vehicle according to the invention. The vehicle may be a vehicle according to the invention. The resetting of the elastic plastic of the second housing section may be effected by a deformation area and/or an additional spring element. The actuation of the switching element is preferably inductive. Before the actuation of the switching element, in particular a detection of an approach can take place, in dependence on which the switching element is brought into an activation state in which the triggering of the vehicle function, in particular the actuation of the switching element, is enabled. The actuation of the switching element takes place in particular as a result of the movement of the second housing section. If a circumferential connection area is moved along with the movement of the second housing section, a full-area actuation by a user may be possible. As a result, an actuation of the actuation device may be simplified. Furthermore, the coupling of the connection area with the deformation area may enable a compact design of the actuation device.

Figure 2:
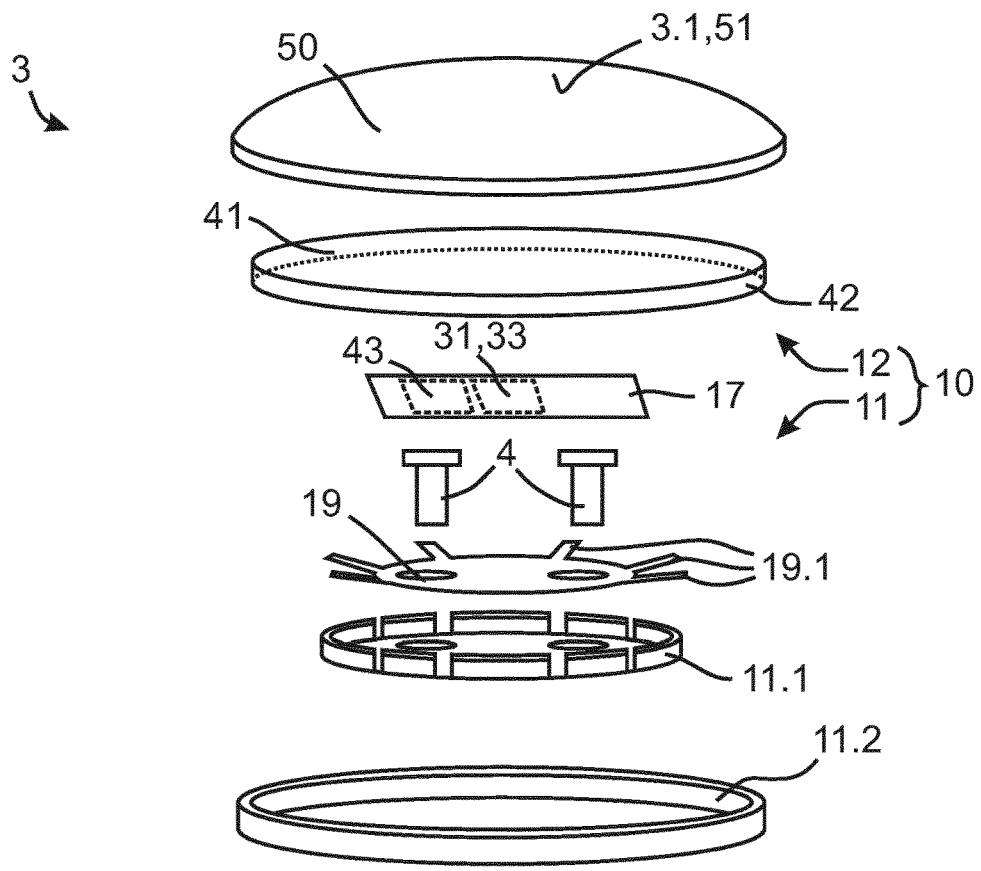
Figure 3:
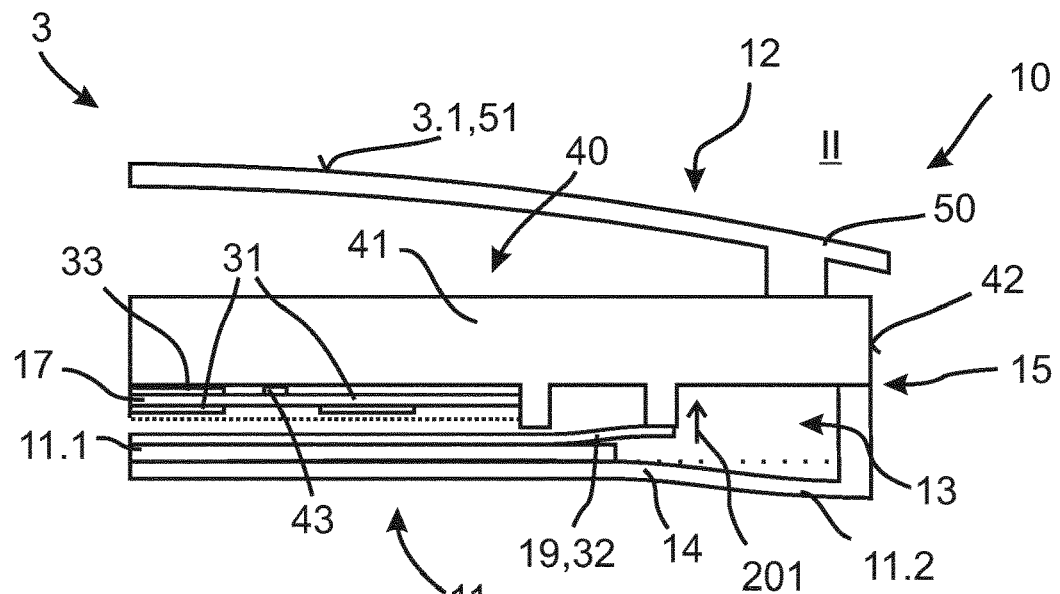
Figure 4:
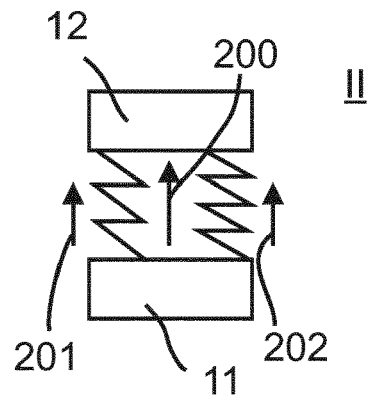
Figure 5:
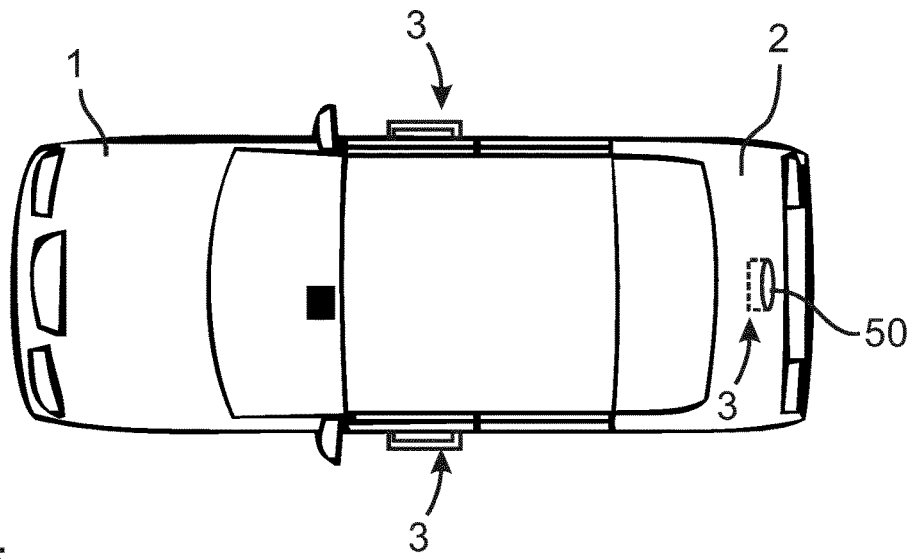
Figure 6:
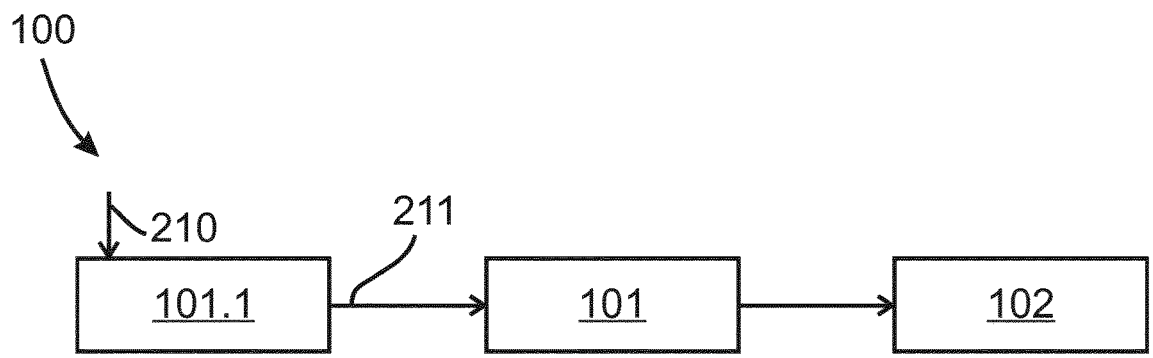
Figure 7:
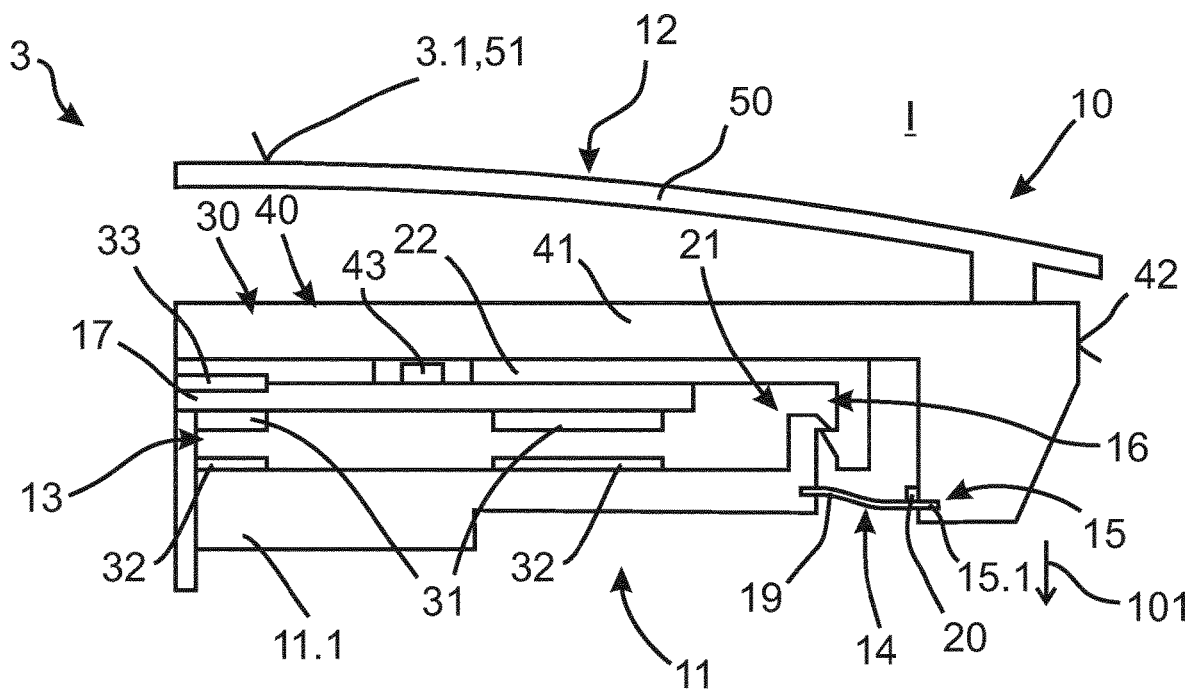
Figure 8:
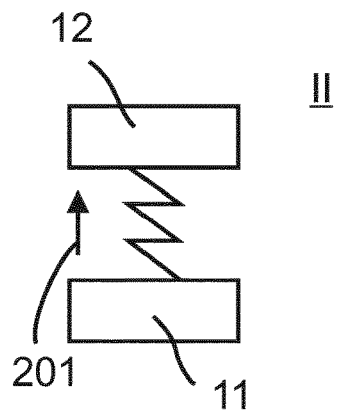

Further advantages, features and details of the invention will be apparent from the following description, in which embodiments of the invention are described in detail with reference to the drawings. With this, the features mentioned in the claims and in the description may each be essential to the invention individually or in any combination. It schematically shows:

FIG. 1 a cross-sectional view of an actuation device according to the invention in a first embodiment, FIG. 2 is a simplified exploded view of the actuation device, FIG. 3 the actuation device in a partially enlarged cross-sectional view, FIG. 4 an operating relationship of a housing unit of the actuation device, FIG. 5 a vehicle according to the invention with the actuation device, FIG. 6 a method according to the invention for triggering a vehicle function of the vehicle by the actuation device in schematic representation of method steps, FIG. 7 an actuation device according to the invention in a partially enlarged cross-sectional view in a second embodiment, FIG. 8 a functional relationship of a housing unit of the actuation device of the second embodiment, FIG. 9 an actuation device according to the invention in a partially enlarged cross-sectional view in a further embodiment, and FIGS. 10*a*-10*b* different actuation positions of the actuation device of the first embodiment for effecting an actuation sequence.

In the following description of some embodiments of the invention, the identical reference signs are used for the same technical features even in different embodiments.

FIG. 1 shows an actuation device 3 according to the invention, which is mounted in particular on a vehicle part 2 of a vehicle 1 according to the invention. The vehicle 1 with the actuation device 3 is shown in FIG. 5. The vehicle part 2 is a movable vehicle part in the form of a tailgate. However, it is equally conceivable that the actuation device 3 can be mounted on another vehicle part, such as a side door, or in a vehicle interior. In this case, the actuation device 3 may, for example, form a door handle of the vehicle 1 or be integrated in a door handle. The actuation device 3 serves to electrically trigger a vehicle function of the vehicle 1. For example, an actuation of the actuation device 3 may open the vehicle part 2. The actuation device 3 may preferably be fixed to the vehicle part 2 by a fixing means/element 4, preferably screwed to the vehicle part 2. A method for actuation 100 for triggering the vehicle function by the actuation device 3 is shown in schematic sequence in FIG. 6.

As shown in FIG. 1, the actuation device 3 has an electrical switching device 30 with several switching elements 31 for triggering the vehicle function. Instead of several switching elements 31, the actuation device 3 may also comprise only one switching element 31. The switching elements 31 are arranged in a housing interior 13 on the second housing section 12. The housing interior 13 is formed by a first and a second housing section 11, 12 of a housing unit 10 of the actuation device 3. As a result, the switching elements 31 are protected from environmental influences, such as dirt and/or moisture. Furthermore, the switching elements 31 are embedded in a potting compound 18, thereby creating a further safety area against moisture within the housing interior 13. For actuating 101 the switching element 31, the second housing section 12 of the housing unit 10 is movable from a rest position I into an actuation position II at least in certain areas relative to the first housing section 11. The actuation position II is shown in FIG. 3. When the second housing section 12 is moved, the second housing section 12 is moved into a movement free space 16 of the housing interior 13 at least in certain regions, as a result of which a distance between the first and second housing sections 11, 12 in the region of the housing interior 13 is reduced. For this purpose, the actuation device 3 has an actuation surface 51 on an outer side 3.1, on which a user can exert a pressure for moving the second housing section 12 from the rest position I to the actuation position II. The second housing section 12 comprises a vehicle emblem 50, which forms the outer side 3.1 and the actuation surface 51. In particular, only the outer side 3.1 of the actuation device 3 is visible from outside the vehicle 1.

The first housing section 11 further comprises a fluid-tight deformation area 14 which is elastically deformed when the second housing section 12 is moved from the rest position I to the actuation position II. For fluid-tight configuration of the deformation area 14, the first housing section 11 has a cover element 11.2 which is formed in a shell-like manner, as shown in the simplified exploded view in FIG. 2. The housing interior 13 further extends at least regionally between the second housing section 12 and the deformation area 14, the deformation area 14 being arranged in particular between the vehicle part 2 and the second housing section 12, thereby enabling a compact design of the actuation device 3. The cover element 11.2 can be of unitary material design or have a soft component 14.1 in the deformation area 14.

Furthermore, the first and second housing sections 11, 12 are connected to each other in a fluid-tight manner in a connection area 15, in particular on all sides of the housing interior 13. Preferably, the connection area 15 is thereby continuously circumferentially formed and comprises a material connection of the first and second housing sections 11, 12. For example, the first and second housing sections 11, 12 may be welded or glued to each other in the connection area 15 to ensure a continuously circumferential sealing of the housing interior 13 in the connection area 15. The deformation area 14 and the connection area 15 are further mechanically coupled to each other, so that the connection area 15 can be moved along with the deformation of the deformation area 14 as a result of the movement of the second housing section 12 from the rest position I to the actuation position II. In this case, the cover element 11.2 forms the deformation area 14 and a connection section 15.1 of the connection area 15. As a result, a user can use the full surface of the actuation area 51 of the actuation device 3 for actuation. Depending on the configuration of the switching device 30, it does not matter whether the user presses on the outer surface 3.1 only in a certain area, thereby simplifying an operation of the actuation device 3.

The housing unit 10 further comprises a spring element 19, which exerts a restoring force 201 on the second housing section 12 when the second housing section 12 is moved from the rest position I to the actuation position II. The spring element 19 may have a plate-like configuration. Preferably, the spring element 19 comprises a plurality of spring sections 19.1 to provide a circumferential spring action. An interaction of the first and second housing sections 11, 12 with the spring element 19 and the deformation area 14 is shown in FIG. 4. In particular, the deformation area 14 and the spring element 19 have different spring stiffnesses. A total force 200 results from a restoring force 202 of the deformation area 14 and the restoring force 201 of the spring element 19. As a result, an elastic restoration 102 of the second housing section 12 to the rest position I can be performed automatically, in particular after a user has released a pressure from the second housing section 12. Further, this may allow for advantageous rigidity of the actuation device 3, particularly during actuation. In order to fix the second housing section 12 in the non-actuated state in the rest position I, in particular in a form-fitting manner, the housing unit 10 further comprises a positioning device 21. This is preferably a latching connection, in which a positioning element 21.1 in the form of a stop element of the second housing section 12 bears against a positioning element 21.1 in the form of a counter stop element of the second housing section 12 in the rest position I. In order to enable an air exchange of the housing interior 13 with an environment, a compensating element 23 may be integrated in a cable guide for cabling 24 or may be arranged on the cable guide. Alternatively to the compensating element 23, for example, an aperture to a vehicle interior may be provided so that the cabling 24 is preferably freely movable in the area of the aperture.

The switching device 30 comprises an electromagnetic sensor unit, in particular in the form of an LDC sensor. The spring element 19 is arranged in the housing interior 13 and forms a trigger element 32 electrically conductive of the switching device 30 for triggering the switching elements 31. The switching elements 31 are further designed for electromagnetic, i.e. in particular inductive, sensing of the conductor element. Alternatively, capacitive sensing of the conductor element is conceivable, for example. When the second housing section 12 is moved from the rest position I to the actuation position II, the switching elements 31 are moved towards the spring element 19, as a result of which a distance between the switching elements 31 and the spring element 19 changes. A change in an electric and/or magnetic field caused thereby can be detected by the switching elements 31. Furthermore, for evaluating sensor data of the switching device 30, a printed circuit board 17 is arranged in the housing interior 13 and comprises electronics for evaluating sensor data of the switching device 30. Preferably, the switching elements 31 are arranged on the circuit board 17 on a side of the circuit board 17 facing the first housing section 11. In this case, the printed circuit board 17 is arranged on a retaining means/element 12.1 which in particular surrounds the printed circuit board 17 and is encapsulated with the encapsulation compound 18. In addition or alternatively to the potting compound 18, the switching elements 31 and/or the printed circuit board 17 may be covered with a protective lacquer. This may in particular protect the electronics from environmental influences. The sensor data can be evaluated or pre-evaluated by the electronics. For example, the electronics may be designed for error detection and/or digitization of the sensor signals.

Preferably, the switching device 30 further comprises a detection element 33 for detecting 101.1 an approach of a user, by means of which the switching elements 31 can be brought from a deactivation state 210 to an activation state 211 upon the approach of the user. Alternatively, it is further conceivable that the detection element 33 is formed by a module separate from the switching device 30. In the deactivation state 210, actuation, in particular manual actuation, of the switching device 31 by moving the second housing section 12 from the rest position I to the actuation position II is preferably electronically prevented. Thus, it is conceivable that the triggering of the vehicle function is prevented in the deactivation state 210. For example, the switching elements 31 may be electrically deactivated and/or electrically disconnected in the deactivation state 210. In the activation state 211, actuation of the switching elements 31 is possible. The detection element 33 may comprise, for example, a UWB or NFC interface, in particular in the form of an antenna, to detect an approach of a user to the actuation device 3. In particular, the detection 101.1 of the approach of the user and the transfer of the switching elements 31 from the deactivation state 210 to the activation state 211 thus take place before the actuation 101 of the switching elements 31.

FIGS. 10a and 10b further show different actuation positions 220, 221 into which the second housing section 12 can be brought by sweeping over the actuation device 3. Preferably, the switching elements 31 are arranged in an actuation direction 212, so that an actuation sequence in which the switching elements 31 are actuated one after the other can be effected by swiping over the actuation device 3. If a user starts his actuating action at an outer edge of the outer side 3.1, it may be provided that the second housing section 12 is tilted in that the first housing section 11 is more deformed in the area of actuation than at the opposite side. If the user then continues his actuation action along the actuation direction 212, as shown in FIG. 10b, the second housing section 12 aligns and the distances of the switching elements 31 to the spring element 19 change accordingly. Based on the distances of the switching elements 31, it can be detected whether a first actuation position 220 as shown in FIG. 10a or a second actuation position 221 as shown in FIG. 10b is present. Thus, a more complex actuation action can be detected.

Furthermore, an illumination unit 40 for illuminating the actuation device 3 is arranged in the housing interior 13. The illumination unit 40 comprises at least one light source 43, for example in the form of an LED, which is arranged in the housing interior 13, preferably on the printed circuit board 17. In particular, the light source 43 is arranged on a side of the printed circuit board 17 facing the second housing section 12. Furthermore, the illumination unit 40 comprises a light guide 41 formed as a transparent housing element of the second housing section 12. The light guide 41 further comprises a circumferential light emitting surface 42 for circumferentially illuminating the actuation device 3 circumferentially around the second housing section 12. In particular, the light emitting surface 42 is arranged on the edge side of the connection section 15. This allows a circle of light to be created around the vehicle emblem 50 without a user being aware of the illumination unit 40 itself.

FIG. 7 shows an actuation device 3 in a further embodiment, which is mounted in particular on a vehicle part 2 of a vehicle 1 according to the invention. The vehicle 1 may be the vehicle 1 shown in FIG. 5. In this case, the actuation device 3 is configured in particular similarly to the actuation device 3. In order to allow a movement of a second housing section 12 from a rest position I to an actuation position II for actuating an electrical switching device 30, a first housing section 11 comprises a circumferential spring element 19 forming a fluid-tight deformation area 14 of the first housing section 11. For example, the spring element 19 may be ring-like in shape. Further, the spring element 19 is molded to a support element 11.1 of the first housing section 11 and the second housing section 12. A printed circuit board 17 is directly arranged on the support element 11.1. As a result, the spring element 19, i.e. in particular a portion of the spring element 19 fixedly connected to the second housing section 12, forms a connection section 15.1 of a substance-locking connection area for connecting the first and second housing sections 11, 12. Additionally or alternatively, a sealing element 20 may be provided to seal the connection area 15 and/or to enable a substance-locking connection. As shown in FIG. 8, the spring element 19 exerts a restoring force 201 on the second housing section 12 when the second housing section 12 is in the actuation position II.

For triggering a vehicle function of the vehicle 1, the electrical switching device 30 further comprises an electromagnetic sensor unit having at least one trigger element 32 in the form of an electrically conductive conductor element and at least one switching element 31 which is arranged on the second housing section 12. The conductor element 32 is thereby integrated in the first housing section 11 or arranged on the first housing section 11. As a result, a distance between the conductor element and the switching element 31 is reduced when the second housing section 12 is moved from the rest position I to the actuation position II. The reduction of the distance can be detected inductively or capacitively by the switching element 31. An intermediate element 22 is further arranged between the first and second housing sections 11, 12 and comprises a positioning element 21.1 of a positioning device 21 for positively fixing the rest position I of the second housing section 12. As a result, the second housing section 12 may have a shape that is easy to manufacture and/or the switching element 31 may be fixed between the intermediate element 22 and the second housing section 12. In particular, the intermediate element 22 is fixed to the second housing section 12 in a housing interior 13.

FIG. 9 shows an actuation device 3 in a further embodiment, which is mounted in particular on a vehicle part 2 of a vehicle 1 according to the invention. The vehicle 1 may be the vehicle 1 shown in FIG. 5. Thereby, the actuation device 3 of the embodiment example of FIG. 9 substantially corresponds to the actuation device 3 of the embodiment example of FIG. 7. However, according to FIG. 9, a cover element 11.2 of a first housing section 11 forms a fluid-tight deformation area 14 and a connection section 15.1 of a connection area 15 for connecting the first housing section 11 to a second housing section 12 of a housing unit 10 of the actuation device 3. The cover element 11.2 can be of unitary material design or be designed as a two-component plastic injection-moulded part and have a soft component 14.1 in the deformation area 14. In addition, the actuation device 3 has a spring element 19 in a housing interior 13 formed by the first and second housing sections 11, 12, which is therefore protected by the housing unit 10. This results in a spring behavior as shown in FIG. 4 when the second housing section 12 is moved from a rest position I to an actuation position II for actuating an electric switching device 30.

The foregoing explanation of the embodiments describes the present invention solely in the context of examples. Of course, individual features of the embodiments can be freely combined with each other, provided that this is technically sensible, without leaving the scope of the present invention.

LIST OF REFERENCE SIGNS

1 Vehicle
2 Vehicle part
3 Actuation device
3.1 Outer side
4 Fixing element
10 Housing unit
11 first housing section
11.1 Support element
11.2 Cover element
12 Second housing section
12.1 Holding agent
13 Housing interior
14 Deformation area
15 Connection area
15.1 Connection section
16 Movement free space
17 Printed circuit board
18 Encapsulation compound
19 Spring element
19.1 Spring section
20 Sealing element
21 Positioning device
21.1 Positioning element
22 Intermediate element
23 Compensating element
24 Cabling
30 Switching device
31 Switching element
32 Conductor element, in particular trigger element
33 Detection element
40 Illumination unit
41 Light guide
42 Light emitting surface
43 Light source
50 Vehicle emblem
51 Actuation surface
100 Method for actuation
101 Activate
102 Reset
200 Total force
201 Restoring force from 19
202 Restoring force from 14
210 Deactivation state
211 Activation state
212 Actuation direction
220 First actuation position
221 Second actuation position
I Rest position
II Actuation position

The invention claimed is:

1. An actuation device for mounting on a vehicle part comprising
an electrical switching device with at least one electrical switching element for triggering a vehicle function and a trigger element for actuating the switching element, and
a housing unit with at least a first and a second housing section,
wherein the second housing section is movable from a rest position into an actuation position for actuating the switching element at least in areas relative to the first housing section, the electrical switching device being adapted to emit an electrical switching signal when the second housing section is moved from the rest position to the actuation position, wherein the trigger element is arranged on the first housing section, and the switching element is arranged on the second housing section, so that a movement of the second housing section from the rest position into the actuating position moves the switching element toward the trigger element wherein the switching device is arranged on a printed circuit board which is fastened to the second housing section.

2. The actuation device according to claim 1, wherein
the first and second housing sections at least partially form a housing interior in which the switching element is arranged.

3. The actuation device according to claim 2, wherein
the housing interior extends, at least in regions, between the second housing section and a fluid-tight deformation area of the first housing section, which deformation area is mechanically coupled to a circumferential connection area of the first and second housing sections, so that the connection area can be moved with the second housing section during the movement of the second housing section from the rest position into the actuation position.

4. The actuation device according to claim 3, wherein
the connection area is configured for the fluid-tight connection of the first and second housing sections.

5. The actuation device according to claim 3, wherein
the connection area comprises a material-locking connection of the first and second housing sections.

6. The actuation device according to claim 1, wherein
the switching device has at least one conductor element for actuating the switching element, the conductor element being arranged on the first housing section, so that the switching element is moved towards the conductor element when the second housing section is moved from the rest position into the actuation position.

7. The actuation device according to claim 1, wherein
the switching device comprises an electromagnetic sensor unit having an electrically conductive trigger element which forms the conductor element, the switching element being configured for the electromagnetic detection of the conductor element.

8. The actuation device according to claim 1, wherein
the switching device comprises a detection element for detecting an approach of a user, by means of which the switching element can be brought, when the user approaches, from a deactivation state, in which the triggering of the vehicle function by the switching element is prevented, into an activation state, in which the triggering of the vehicle function by the switching element is enabled.

9. The actuation device according to claim 1, wherein
the switching device has at least two electrical switching elements which are arranged in an actuation direction, so that an actuation sequence in which the switching elements are at least actuated successively or differently can be brought about by sweeping over the actuation device.

10. The actuation device according to claim 1, wherein
the printed circuit board is encapsulated with an encapsulation compound or is covered with a protective lacquer.

11. The actuation device according to claim 1, wherein
the first housing section has a cover element which forms a connection section of the connection area.

12. The actuation device according to claim 1, wherein
the cover element forms the deformation area.

13. The actuation device according to claim 1, wherein
the housing unit has a spring element for exerting a restoring force counter to the movement of the second housing section from the rest position into the actuation position.

14. The actuation device according to claim 13, wherein
the spring element forms the conductor element of the switching device.

15. The actuation device according to claim 13, wherein
the connection area has the spring element, the spring element extending circumferentially in the connection area.

16. The actuation device according to claim 13, wherein
the spring element is connected to the second housing section at least in a form-fitting or material-locking manner.

17. The actuation device according to claim 1, wherein
the housing unit has a positioning device by means of which the rest position of the second housing section can be fixed.

18. The actuation device according to claim 17, wherein
an intermediate element is arranged between the first and second housing sections, by means of which intermediate element at least the restoring force of the spring element can be transmitted to the second housing section or which has at least one positioning element of the positioning device.

19. The actuation device according to claim 1, wherein
an illumination unit for illuminating the actuation device is arranged in the housing interior.

20. The actuation device according to claim 19, wherein
the second housing section has a light guide for guiding light from the illumination unit.

21. The actuation device according to claim 1, wherein
the second housing section has a vehicle emblem which forms an actuation surface for triggering the movement of the second housing section from the rest position into the actuation position.

22. The actuation device according to claim 1, wherein
the housing interior has a compensating element for exchanging air with an environment.

23. A vehicle comprising
a vehicle part,
wherein
an actuation device according to claim 1 for triggering a vehicle function of the vehicle is arranged on the vehicle part.

24. A method for actuation for triggering a vehicle function of a vehicle by an actuation device, according to claim 1, comprising:
Actuation of the electrical switching element of the electrical switching device for triggering the vehicle function by moving the second housing section with the switching element from a rest position to an actuation position,
Resilient return of the second housing section with the switching element to the rest position.

* * * * *